(12) United States Patent
Dournelle et al.

(10) Patent No.: US 7,336,460 B2
(45) Date of Patent: Feb. 26, 2008

(54) PROTECTION OF AN INTEGRATED CIRCUIT AGAINST ELECTROSTATIC DISCHARGES

(75) Inventors: Stéphanie Dournelle, Theys (FR); Pascal Salome, Vif (FR)

(73) Assignee: STMicroelectronics SA, Montrouge (FR)

( * ) Notice: Subject to any disclaimer, the term of this patent is extended or adjusted under 35 U.S.C. 154(b) by 216 days.

(21) Appl. No.: 11/138,655

(22) Filed: May 26, 2005

(65) Prior Publication Data

US 2005/0275031 A1    Dec. 15, 2005

(30) Foreign Application Priority Data

May 26, 2004  (FR) ................................. 04 51040

(51) Int. Cl.
*H02H 9/00* (2006.01)
(52) U.S. Cl. ............................................ 361/56
(58) Field of Classification Search ........... 361/56, 361/111; 257/355
See application file for complete search history.

(56) References Cited

U.S. PATENT DOCUMENTS

| 5,550,699 | A | 8/1996 | Diaz | |
|---|---|---|---|---|
| 6,347,026 | B1 * | 2/2002 | Sung et al. | 361/56 |
| 6,522,511 | B1 | 2/2003 | John et al. | |
| 6,744,611 | B2 * | 6/2004 | Yang et al. | 361/56 |
| 7,071,514 | B1 * | 7/2006 | Ozard | 257/355 |
| 7,087,938 | B2 * | 8/2006 | Streibl et al. | 257/173 |

FOREIGN PATENT DOCUMENTS

WO    WO 03/081742 A    10/2003

OTHER PUBLICATIONS

French Search Report, Jan. 12, 2005, French Application Nos. FR 0451040 / FA 649830, 2 pages.

* cited by examiner

*Primary Examiner*—Michael Sherry
*Assistant Examiner*—Boris Benenson
(74) *Attorney, Agent, or Firm*—Graybeal Jackson Haley LLP

(57) ABSTRACT

A circuit of protection against electrostatic discharges, comprising a first MOS transistor for detecting a leakage current between a first input node of a circuit to be protected and a second node at an output voltage, a second MOS transistor constitute of a switch directly connecting said nodes, and a leakage current amplifier in the first transistor to control the second one.

24 Claims, 2 Drawing Sheets

PROTECTION OF AN INTEGRATED CIRCUIT AGAINST ELECTROSTATIC DISCHARGES

PRIORITY CLAIM

This application claims priority from French patent application No. 04/51040, filed May 26, 2004, which is incorporated herein by reference.

BACKGROUND OF THE INVENTION

1. Field of the Invention

The present invention relates to the protection of input/output terminals of an integrated circuit against electrostatic discharges (ESD). Such protections are generally provided on the pads of an integrated circuit and consist of connecting these pads to a reference voltage (generally, the ground) to carry off a possible electrostatic discharge. A point in an electronic circuit sensitive to electrostatic discharges can also be protected.

2. Discussion of the Related Art

FIG. 1 is a schematic and simplified block diagram of a circuit 1 for protecting an input/output stage 2 (I/O) of an integrated function 3 (FCT). In FIG. 1, the input/output stage is assumed to be connected on the one hand to a pad 4, the entire circuit (2+3) being further connected to a pad 5 representing a reference voltage (here, ground GND).

A protection device 1 is essentially formed of a switch, generally unidirectional, directly connecting pad 4 to ground 5. This switch is controlled upon occurrence of an electrostatic discharge on pad 4 of the integrated circuit. This control is illustrated in FIG. 1 by a dotted line ESD.

In MOS technology integrated circuits, the occurrence of an electrostatic discharge is often detected by an N-channel MOS transistor having its drain defining anode A of switch 1 connected to pad 4 and having its source connected to the gate and defining grounded cathode K FIG. 2A shows a first known example of an ESD protection switch 1. The switch is an N-channel MOS transistor M1 having its gate G, source S, and bulk B interconnected and defining cathode K of the switch and having its drain D forming anode A. In fact, the presence of an electrostatic discharge starts an NPN bipolar transistor intrinsic to the MOS transistor. This transistor is shown in dotted lines in FIG. 2A by its equivalent electric diagram. It is an NPN transistor having its collector corresponding to drain D of transistor M1, having its emitter corresponding to source S of transistor M1, and having its base corresponding to bulk B of transistor M1.

The protection capacity of switch 1 depends on the size of transistor M1. In practice, this protection capacity generally is on the order of a few tens of volts per micrometer of gate width of transistor M1.

FIG. 2B shows a second known example of an ESD protection switch 1'. Here, a transistor M1', connected like transistor M1 of FIG. 2A, is associated with a cathode-gate thyristor THK having its anode connected to the drain of transistor M1' (anode A of switch 1') and having its cathode connected to the source of transistor M1' (cathode K of switch 1'). Gate G of thyristor THK is connected to the source (and thus to the gate) of transistor M1'. In FIG. 2B, thyristor THK has been symbolized in the form of a PNP transistor 11 and of an NPN transistor 12 in usual fashion. The emitter of the PNP transistor defines anode A of the thyristor and its collector is connected to the base of transistor 12 which defines gate G' of the thyristor. The base of PNP transistor 11 is connected to the collector of NPN transistor 12 and the emitter of the latter defines cathode K of the thyristor, a resistor R connecting the gate to the cathode to enable starting of the thyristor.

The structure of FIG. 2B enables decreasing the size of MOS transistor M1' for a same protection capacity, a thyristor being generally able to stand on the order of 100 volts per micrometer of width.

The function of transistors 11 and 12 forming the thyristor is the same as that of the parasitic bipolar transistor of the MOS transistor, that is, absorbing the current of the electrostatic discharge and thus avoiding damaging the gate of the MOS transistor.

A disadvantage of the conventional ESD protection switches of FIGS. 2A and 2B is linked to a manufacturing parameter of N-channel MOS transistor M1 or M1' in so-called low-cost technologies. This parameter is the so-called GIDL parameter (Gate Induced Drain Leakage) which corresponds to a current leakage between the drain and the gate of the MOS transistor. This leakage appears as soon as a voltage is applied between the drain and the source of the MOS transistor (and thus between the gate and the drain, since the gates and sources are here interconnected). The occurrence of this leakage turns on the MOS transistor before it has been able to turn on its parasitic bipolar NPN transistor. Accordingly, this bipolar transistor remains off and the magnitude of the current (the electrostatic discharge) damages the actual MOS transistor.

SUMMARY OF THE INVENTION

An aspect of the present invention aims at overcoming the disadvantages of known ESD protections and especially at providing a solution which is not sensitive to GIDL parameters of the MOS transistors starting the electrostatic switch.

An aspect of the present invention more generally aims at providing a solution which is compatible with any function (more specifically, input/output stage) to be protected.

Another aspect of the present invention also aims at providing a solution which does not require optimizing in expensive fashion the MOS transistor parameters.

According to one aspect of the present invention, a circuit provides protection against electrostatic discharges, comprising:

a first MOS transistor for detecting a leakage current between a first input node of a circuit to be protected and a second node at an output voltage;

a second MOS transistor constitute of a switch directly connecting said nodes; and a leakage current amplifier in the first transistor to control the second one.

According to an aspect of the present invention, said amplifier is formed of a current mirror assembly of MOS transistors.

According to an aspect of the present invention, a current-to-voltage converter is interposed between the gate of the second transistor and the amplifier output.

According to an aspect of the present invention, the amplification gain is selected so that the second transistor is turned on under the effect of a gate-drain leakage current of the first transistor.

According to an aspect of the present invention, the circuit further comprises a capacitive element directly connecting the gate of the second transistor to the first node.

According to an aspect of the present invention, said second transistor controls a thyristor.

According to an aspect of the present invention, said input node is a first pad or a first input/output terminal of the circuit to be protected.

According to an aspect of the present invention, said node at an output voltage is a second pad or a second input/output terminal of the circuit to be protected.

According to an aspect of the present invention, the second terminal is directly connected to ground, which forms the output voltage.

Features, and advantages of the present invention will be discussed in detail in the following non-limiting description of specific embodiments in connection with the accompanying drawings.

DETAILED DESCRIPTION

Figure 1:
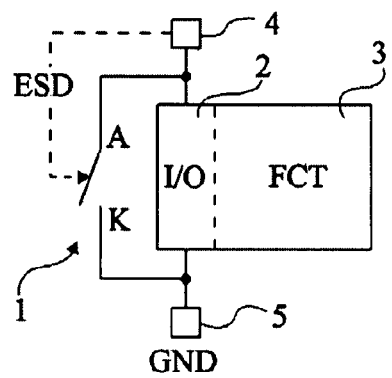
FIG. 1, previously described, very schematically shows the architecture of a circuit of protection against an electrostatic discharge to which the present invention applies.

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Same reference numerals have been used to designate same elements in the different drawings. For clarity, only those elements necessary to the understanding of the present invention have been shown in the drawings and will be described hereafter. In particular, the functions or applications which are connected to the input/output pads protected by a circuit of the described embodiments of the present invention have not been detailed, these embodiments being compatible with the protection of any conventional input/output circuit. Further, embodiments of the present invention will be described hereafter in relation with a preferred example of application to the protection of pads or input/output terminals of an integrated circuit. However, all that will be described also applies to the protection of an internal point of the circuit not directly accessible outside of the circuit and which is desired to be protected against ESDs.

A feature of the embodiments of present invention is to amplify the leakage current present in an N-channel MOS transistor undergoing an electrostatic discharge, to start (turn on) another N-channel MOS transistor forming the actual protection switch.

Figure 3:
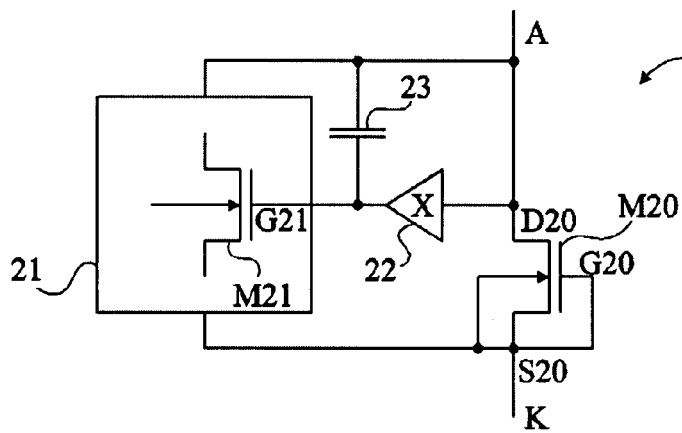
FIG. 3 very schematically illustrates the functional principle of a circuit for controlling an electrostatic protection switch according to an embodiment of the present invention.

FIG. 3 very schematically illustrates the principle of a circuit 19 of protection against electrostatic discharges according to an embodiment of the present invention. For simplification, the circuit to be protected and the input/output pads (4, 5, FIG. 1) have not been shown in FIG. 3. Only terminals A and K of the switch have been illustrated, the connection of these terminals being conventional per se.

According to this embodiment of the present invention, a first N-channel MOS transistor M20 has its source S20 connected to its gate G20 and to cathode K of switch 19, the drain of transistor M20 being directly connected to anode A of switch 19. A second N-channel MOS transistor M21 constitutive of a protection switch 21 capable of short-circuiting terminals A and K receives on its gate G21 a voltage corresponding to the amplification, by an amplifier 22, of the possible leakage current of transistor M20. The function of amplifier 22 is to turn on switch 21 before a possible leakage in transistor M20 has caused the breakdown thereof.

Preferably, a capacitive element 23 connects anode A of circuit 19 to gate G21 of transistor M21. The function of this optional capacitor is to accelerate the circuit turning-on in the presence of an electrostatic discharge by starting to charge gate G21 of transistor M21 before said transistor is turned on by amplifier 22.

Upon occurrence of an electrostatic discharge on terminal A, a leakage current tends to flow into transistor M20 which is permanently blocked by its gate-to-source connection. Amplifier 22 amplifies this leakage current to drive gate G21 and turn on transistor M21.

Figure 4:
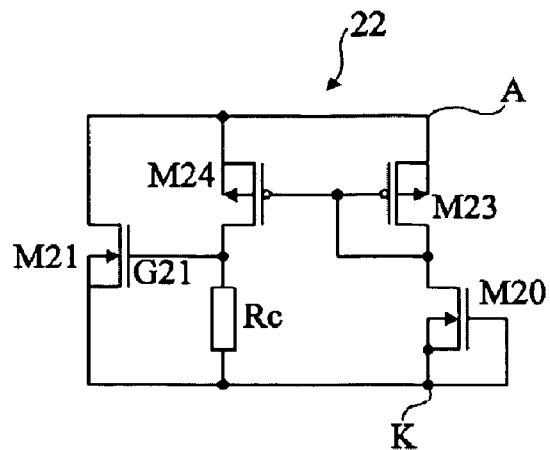
FIG. 4 shows an example of an electric diagram of an ESD protection switch and of its control circuit according to a first embodiment of the present invention.

FIG. 4 shows a first simplified example of the forming of an amplifier 22. The amplifier is formed of a current mirror assembly formed of a first P-channel transistor M23 in series with transistor M20 and of a second P-channel transistor M24 mirror-assembled on transistor M23. The gate and the drain of transistor M23 are connected together to the drain of transistor M20 while the source of transistor M23 is connected to terminal A of the circuit. The gates of transistors M23 and M24 are interconnected. The source of transistor M24 is connected to terminal A while its drain is connected to gate G21 of transistor M21. A resistor Rc defines a current-to-voltage converter by connecting the drain of transistor M24 to ground K The gain of amplifier 22 is set by the surface ratio between transistors M23 and M24.

Figure 2A:
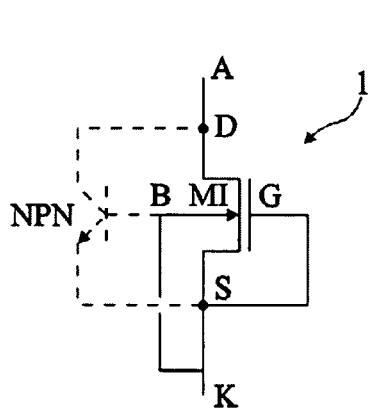
FIGS. 2A and 2B show conventional examples of protection switches.

In the example of FIG. 4, transistor M21 alone forms circuit 21. This is an equivalent to the previously-described assembly of FIG. 2A As long as no current flows through transistor M23 (that is, as long as there is no electrostatic discharge or leakage between the gate and the source of transistor M20, the current in transistor M24 is also zero. Transistor M21 sees a zero voltage on its gate and is thus off.

As soon as a current flows through transistor M23 (even a very small current on the order of a few nanoamperes corresponding to leakage current GIDL), the transistor M24 selected to have a larger surface area than transistor M23 conducts with a current proportional to the current in transistor 23. Under the effect of the current-to-voltage conversion by resistor Rc, gate G21 sees the occurrence of a voltage which turns on transistor M21.

Transistor M20 actually forms a transistor of detection of a possible discharge while transistor M21 forms (alone or with a thyristor, as will be seen hereafter) the element short-circuiting terminals A and K under control of transistor M20.

The amplification ratio is selected (for example, at least 10) to ensure that transistor M21 is turned on before the leakage current flowing through transistor M20 has had the possibility to damage it.

Figure 2B:
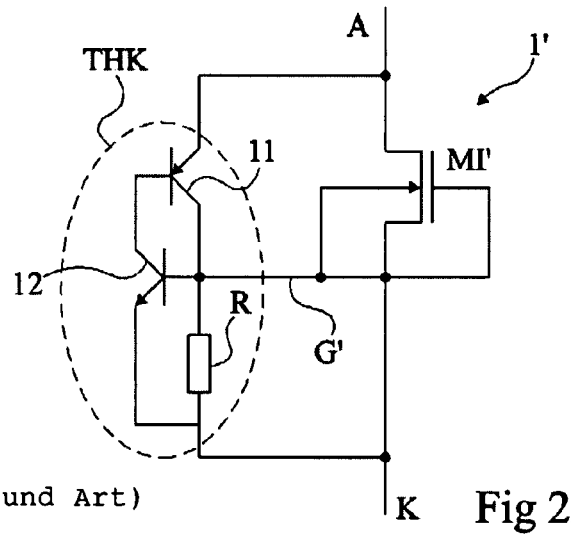
Figure 5:
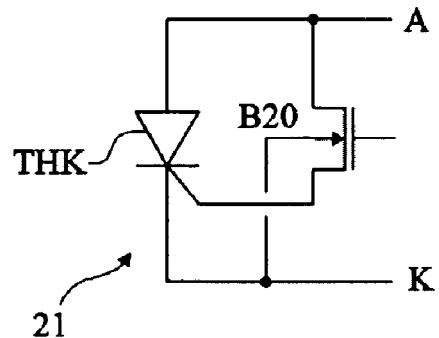
FIG. 5 partially shows an alternative of an ESD protection switch according to an embodiment of the present invention.

FIG. 5 shows a second embodiment of a switch 21 according to an embodiment of the present invention. For simplification, only transistor M21 and the rest of circuit 21 have been shown in FIG. 5, the control structure being conformal to the other embodiments. In this example, MOS transistor M21 controls a cathode-gate thyristor THK having its respective anode and cathode connected to terminals A and K of the assembly. The drain of transistor M21 is connected to terminal A, its source is connected to the gate of thyristor THK, and its substrate B20 is connected to cathode K As compared to the switch of FIG. 2B, the gate of transistor M21 here is not connected to its source but receives the voltage control from amplifier 22.

Figure 6:
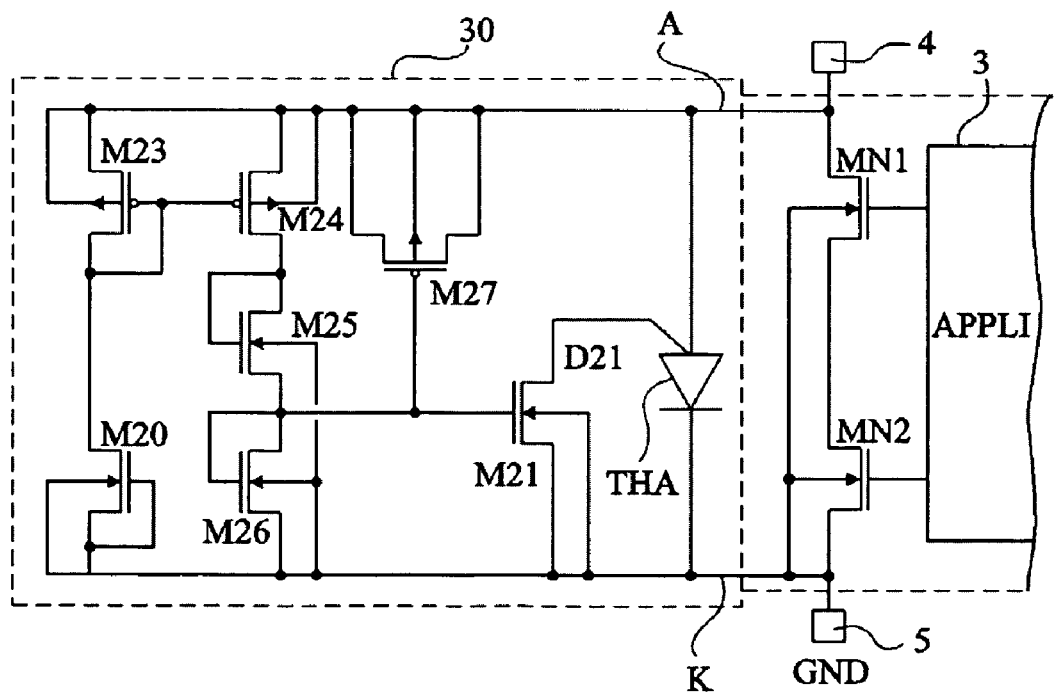
FIG. 6 is a detailed electric diagram of a circuit of protection against electrostatic discharges according to another embodiment of the present invention.

FIG. 6 shows an electric diagram of a circuit 30 of protection against electrostatic discharges according to a preferred embodiment of the present invention. In this example, element 21 is formed of an anode-gate thyristor THA having its gate connected to drain D21 of transistor M21, the source and substrate of transistor M21 being connected to terminal K forming the cathode of thyristor THA.

In the embodiment of FIG. 6, the current-to-voltage conversion is performed by means of a resistive dividing bridge formed of two diode-assembled N-channel MOS transistors M25 and M26 having their junction point directly connected to the gate of transistor M21. The source of transistor M26 is connected to terminal K while its drain is connected to the source of transistor M25 having its drain connected to the drain of transistor M24. The respective gates of transistors M25 and M26 are connected to their respective drains and the substrates of transistors M25 and M26 are connected together to terminal K The rest of the assembly of transistors M23, M24, and M20 is similar to the embodiment of FIG. 4.

In FIG. 6, capacitance 23 has been shown in the form of a P-channel transistor M27 having its drain, source, and substrate connected to terminal A while the gate is connected to the gate of transistor M21.

In the example of FIG. 6, the circuit to be protected is an output stage formed of two N-channel MOS transistors MN1 and MN2 in series between terminals 4 and 5, the drain of transistor MN1 being connected (in the air) to terminal or pad 4, its source being connected to the drain of transistor MN2 having its source connected to ground GND. The gates of transistors MN1 and MN2 receive signals originating from any circuit 3 (APPLI) and their substrates are grounded.

An advantage of this embodiment of the present invention is that its operation is independent from the quality of the N-channel MOS transistors in terms of GIDL parameter. In particular, even for high-performance transistors (with no leakage current), the presence of an electrostatic discharge will turn on transistor M21 like conventional transistor M1 of FIG. 2A, since transistor M23 is always on. Similarly, for a transistor having a high GIDL parameter, the amplification performed by amplifier 22 will avoid any damage on the transistors.

Of course, embodiments of the present invention are likely to have various alterations, modifications, and improvements which will readily occur to those skilled in the art. In particular, the sizes to be given to the different transistors are within the abilities of those skilled in the art based on the functional indications given hereabove.

Further, embodiments of the present invention have been described hereabove in relation with an example of application to N-channel MOS transistors. Its transposition to an assembly intended to protect an output stage with P-channel transistors is within the abilities of those skilled in the art.

Further, although embodiments of the present invention have been described in relation with an application where the protection circuit is grounded, it more generally applies to short-circuit two points at different voltages, one of the points being a point sensitive to electrostatic discharges. For example, terminal K may correspond to an output terminal not directly grounded and terminal A may correspond to a point internal to the integrated circuit (for example, a high impedance input of an element), sensitive to electrostatic discharges. The integrated circuit may include circuitry to perform any desired function, such as memory, processing, and so on.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A circuit for protection against electrostatic discharges, comprising:
   a first MOS transistor for detecting a leakage current between a first node of a circuit to be protected and a second node of the circuit to be protected;
   a second MOS transistor constitutive of a switch directly connecting said nodes; and
   a leakage current amplifier coupled to the first transistor to control the second MOS transistor, wherein said leakage current amplifier is formed of a current mirror assembly of MOS transistors.

2. The circuit of claim 1, wherein a current-to-voltage converter is interposed between a gate of the second transistor and the output of the amplifier.

3. The circuit of claim 1, wherein the amplification gain is selected so that the second transistor is turned on under the effect of a gate-drain leakage current of the first transistor.

4. The circuit of claim 1, further comprising a capacitive element directly connecting the gate of the second transistor to the first node.

5. The circuit of claim 1, wherein said second transistor controls a thyristor.

6. The circuit of claim 1, wherein said first node is a first pad or a first input/output terminal of the circuit to be protected.

7. The circuit of claim 1, wherein said second node is a second pad or a second input/output terminal of the circuit to be protected.

8. The circuit of claim 7, wherein the second node is directly connected to ground to thereby provide voltage on the node.

9. An electrostatic discharge protection circuit adapted to be coupled across first and second nodes of a circuit being protected against electrostatic discharges, the protection circuit comprising:
   a first MOS transistor adapted to be coupled to the first and second nodes, the first MOS transistor having a leakage current that flows from the first node to the second node through the first MOS transistor responsive to an electrostatic discharge across the nodes;
   a second switching circuit adapted to be coupled to the first and second nodes and having a control input, the second switching circuit operable to couple the first node to the second node responsive to a leakage indication signal applied to the control input; and a leakage current detector coupled to the first MOS transistor and the second switching circuit, the leakage current detector operable detect the leakage current through the first MOS transistor and operable to apply the leakage indication signal to the second switching circuit responsive to the detected leakage current.

10. The circuit of claim 9 wherein the leakage current detector comprises an amplifier operable to generate the leakage indication signal having a magnitude that is a function of a magnitude of the leakage current through the first MOS transistor.

11. The circuit of claim 9 wherein the leakage current detector includes a current mirror having a first current sensing transistor coupled in series with the first MOS transistor.

12. The circuit of claim 11, wherein the current mirror further comprises a second current sensing transistor coupled in series with a current-to-voltage converter between the first and second nodes, with a second current proportional to the leakage current flowing through the second current sensing transistor and current-to-voltage converter and the current-to-voltage converter being operable, in response to the second current, to generate a voltage corresponding to the leakage indication signal.

13. An electrostatic discharge protection circuit adapted to be coupled across first and second nodes of a circuit being protected against electrostatic discharges, the protection circuit comprising:
a first switching circuit adapted to be coupled to the first and second nodes, the first switching circuit having a leakage current that flows from the first node to the second node through the first switching circuit responsive to an electrostatic discharge across the nodes;
a second switching circuit adapted to be coupled to the first and second nodes and having a control input, the second switching circuit operable to couple the first node to the second node responsive to a leakage indication signal applied to the control input;
a leakage current detector coupled to the first and second switching circuits, the leakage current detector operable detect the leakage current through the first switching circuit and operable to apply the leakage indication signal to the second switching circuit responsive to the detected leakage current; and
a capacitive element coupled between the first node and an output node of the leakage current detector on which the leakage indication signal is generated.

14. The circuit of claim 13 wherein the second switching circuit comprises a MOS transistor.

15. The circuit of claim 14 wherein the current-to-voltage converter comprises either a resistive element or suitably sized series connected MOS transistors the collectively form a voltage divider.

16. An electrostatic discharge protection circuit adapted to be coupled across first and second nodes of a circuit being protected against electrostatic discharges, the protection circuit comprising:
a first switching circuit adapted to be coupled to the first and second nodes, the first switching circuit having a leakage current that flows from the first node to the second node through the first switching circuit responsive to an electrostatic discharge across the nodes;
a second switching circuit adapted to be coupled to the first and second nodes and having a control input, the second switching circuit operable to couple the first node to the second node responsive to a leakage indication signal applied to the control input; and
a leakage current detector coupled to the first and second switching circuits, the leakage current detector operable detect the leakage current through the first switching circuit and operable to apply the leakage indication signal to the second switching circuit responsive to the detected leakage current; and
wherein the second switching circuit comprises a MOS transistor coupled to a thyristor.

17. An electronic system, comprising:
an integrated circuit including an electrostatic discharge protection circuit coupled across first and second nodes of a circuit contained in the integrated circuit that is being protected against electrostatic discharges, the protection circuit including,
a first MOS transistor adapted to be coupled to the first and second nodes, the first MOS transistor having a leakage current that flows from the first node to the second node through the first MOS transistor responsive to an electrostatic discharge across the nodes;
a second switching circuit adapted to be coupled to the first and second nodes and having a control input, the second switching circuit operable to couple the first node to the second node responsive to a leakage indication signal applied to the control input; and
a leakage current detector coupled to the first MOS transistor and the second switching circuit, the leakage current detector operable detect the leakage current through the first MOS transistor and operable to apply the leakage indication signal to the second switching circuit responsive to the detected leakage current.

18. The electronic system of claim 17 wherein the first and second nodes of the integrated circuit correspond to nodes of the integrated circuit that are externally accessible.

19. The electronic system of claim 17 wherein the first and second nodes of the integrated circuit correspond to internal nodes of the integrated circuit that are not externally accessible.

20. The electronic system of claim 17 wherein the integrated circuit comprises a memory device.

21. A method of protecting a circuit against electrostatic discharges, the circuit including first and second nodes and the method comprising:
detecting a leakage current flowing from the first node to the second node in response an electrostatic discharge across the nodes:
generating a leakage indication signal responsive to the detected leakage current;
in response to the leakage indication signal, coupling the first node to the second node; and
wherein the leakage current corresponds to a gate induced drain leakage current through a MOS transistor coupled between the first and second nodes.

22. The method of claim 21 wherein generating a leakage indication signal comprises:
mirroring the detected leakage current to generate a mirrored leakage current; and
converting the mirrored leakage current to a voltage corresponding to the leakage indication signal.

23. The method of claim 21 wherein mirroring the detected leakage current to generate a mirrored leakage current includes increasing a magnitude of the mirrored leakage current relative to a magnitude of the detected leakage current.

24. The method of claim 23 wherein a gain is defined by the ratio of the mirrored leakage current to the detected leakage current, the gain selected to have a value that that ensures the coupling of the first node to the second node occurs prior to the gate induced drain leakage current damaging the MOS transistor.

* * * * *

UNITED STATES PATENT AND TRADEMARK OFFICE
CERTIFICATE OF CORRECTION

PATENT NO. : 7,336,460 B2
APPLICATION NO. : 11/138655
DATED : February 26, 2008
INVENTOR(S) : Stephanie Dournelle and Pascal Salome It is certified that error appears in the above-identified patent and that said Letters Patent is hereby corrected as shown below:

Column 9, line 3 please remove the second [that]

Signed and Sealed this

Twelfth Day of August, 2008

JON W. DUDAS
*Director of the United States Patent and Trademark Office*